United States Patent
Bellman et al.

(10) Patent No.: US 9,984,786 B2
(45) Date of Patent: May 29, 2018

(54) SPUTTERED TRANSPARENT CONDUCTIVE ALUMINUM DOPED ZINC OXIDE FILMS

(71) Applicant: Corning Incorporated, Corning, NY (US)

(72) Inventors: Robert Alan Bellman, Painted Post, NY (US); Jeremy Curtis Clark, Addison, NY (US); Paul Arthur Sachenik, Corning, NY (US); Lynn Bernard Simpson, Painted Post, NY (US); Lili Tian, Laurel, MD (US)

(73) Assignee: Corning Incorporated, Corning, NY (US)

( * ) Notice: Subject to any disclaimer, the term of this patent is extended or adjusted under 35 U.S.C. 154(b) by 5 days.

(21) Appl. No.: 14/434,229

(22) PCT Filed: Oct. 4, 2013

(86) PCT No.: PCT/US2013/063414
§ 371 (c)(1),
(2) Date: Apr. 8, 2015

(87) PCT Pub. No.: WO2014/058726
PCT Pub. Date: Apr. 17, 2014

(65) Prior Publication Data
US 2015/0279500 A1 Oct. 1, 2015

Related U.S. Application Data

(60) Provisional application No. 61/731,172, filed on Nov. 29, 2012, provisional application No. 61/710,848, filed on Oct. 8, 2012.

(51) Int. Cl.
*H01B 1/08* (2006.01)
*C23C 14/08* (2006.01)
(Continued)

(52) U.S. Cl.
CPC ............. *H01B 1/08* (2013.01); *C23C 14/086* (2013.01); *C23C 14/3485* (2013.01); *H01B 5/14* (2013.01);
(Continued)

(58) Field of Classification Search
CPC ........................................................ H01B 1/08
(Continued)

(56) References Cited

U.S. PATENT DOCUMENTS

| 8,133,828 B2 | 3/2012 | Denry et al. |
| 2011/0220198 A1 | 9/2011 | Tandon et al. |
| 2012/0326118 A1* | 12/2012 | Nitta ..................... H01L 33/385 257/13 |

FOREIGN PATENT DOCUMENTS

CN  101660120  3/2010

OTHER PUBLICATIONS

Yang et al.; "Resistivity improvement of Al-doped ZnO film by bipolar pulsed dc magnetron sputtering with high Ar flow rate"; Current Applied Physics, vol. 12, May 18, 2012; pp. S99-S103.
(Continued)

*Primary Examiner* — Brent T O'Hern
(74) *Attorney, Agent, or Firm* — Gregory V. Bean

(57) ABSTRACT

Disclosed are AZO films deposited on a transparent substrate by pulse DC using an oxide target with a composition in the range 0.5-2 wt % $Al_2O_3$, desirably at temperature above 325° C., resulting in films showing columnar grain structure with columns extending from the top to the bottom of the film, and small lateral grain size (less than 70 nm from substrate to top of film). The film has low resistivity at less than 10 Ohm/square at a thickness less than 400 nm, resistivity is desirably unchanged by annealing at temperatures of up to 450° C.

13 Claims, 7 Drawing Sheets

(51) Int. Cl.
  *C23C 14/34* (2006.01)
  *H01L 31/18* (2006.01)
  *H01B 5/14* (2006.01)
  *H01L 31/0224* (2006.01)

(52) U.S. Cl.
  CPC .. *H01L 31/022483* (2013.01); *H01L 31/1884* (2013.01); *Y02E 10/50* (2013.01); *Y10T 428/24355* (2015.01)

(58) Field of Classification Search
  USPC .......................................................... 428/119
  See application file for complete search history.

(56) References Cited

OTHER PUBLICATIONS

Cebulla et al.; "Al-doped zinc oxide films deposited by simultaneous rf and dc excitation of a magnetron plasma: Relationships between plasma parameters and structural and electrical film properties"; Journal of Applied Physics, American Institute of Physics. New York, US, vol. 83, No. 2, Jan. 15, 1998; pp. 1087-1095.
Ayadi et al.; "The properties of aluminum-doped zinc oxide thin films prepared by rf-magnetron sputtering from nanopowder targets", Materials Science and Engineering C, Elsevier Science S.A., CH, vol. 28, No. 5-6, Oct. 12, 2007; pp. 613-617.
Agashe et al.; "Efforts to improve carrier mobility in radio frequency sputtered aluminum doped zinc oxide films", Journal of Applied Physics, American Institute of Physics. New York, US, vol. 95, No. 4, Feb. 15, 2004; pp. 1911-1917.
Berginski et al.; "The effect of front ZnO:Al surface texture and optical transparency on efficient light trapping in silicon thin-film solar cells"; Journal of Applied Physics, American Institute of Physics. New York, US, vol. 101, No. 7, Apr. 9, 2007; pp. 74903-074903.
Mosbah et al.; "Influence of deposition temperature on structural, optical and electrical properties of sputtered Al doped ZnO thin films"; Journal of Alloys and Compounds, Elsevier Sequoia, Lausanne, CH, vol. 515, Nov. 24, 2011; pp. 149-153.
Minami et al; "Preparations of ZnO:Al transparent conducting films by d.c. magnetron sputtering"; This Solid Films, Elsevier-Sequoia S.A. Lausanne, CH, vol. 193-194, Dec. 15, 1990; pp. 721-729.
Jiang et al.; "Manufacture of specific structure of aluminum-doped zinc oxide films by patterning the substrate surface"; Applied Physics Letters; AIP, American Institute of Physics, Melville, NY, US, vol. 80, No. 17, Apr. 29, 2002; pp. 3090-3092.
Berginski et al.; "Recent development on surface-textured ZnO:Al films prepared by sputtering for thin-film solar cell application"; Thin Solid Films, Elsevier-Sequoia S.A., Lausanne, CH, vol. 516, No. 17, Oct. 16, 2007; pp. 5836-5841.
European Patent Office; International Search Report; dated Nov. 22, 2013; pp. 1-5.
The International Bureau of WIPO; International Preliminary Report on Patentability; dated Apr. 16, 2015; pp. 1-9.
An et al; "Deposition of ZNO:AL Films by Pulsed DC Magnetron Sputtering"; Vacuum; vol. 48, No. 5; Sep. 2011; p. 82-85.
Berginski et al; "Design of ZNO: AL Films With Optimized Surface Texture for Silicon Thin-Film Solar Cells"; Proc. of SPIE; vol. 6197; 2006; pp. 61970Y-1-61970Y-10.
Chang et al; "The Effect of Deposition Temperature on the Properties of AL-Doped Zinc Oxide Thin Films"; Thin Solid Films 386 (2001) 79-86.
Ellmer; "Resistivity of Polycrystalline Zinc Oxide Films; Current Status and Physical Limit"; J. Phys. D. Appl. Phys. 34 (2001) 3097-3108.
English Translation of CN201380063481.4 Notice of First Office Action Dated August 9, 2016; 11 Pages; Chinese Patent Office.
Fu et al; "Substrate Temperature Dependence of the Properties of ZAO Thin Films Deposited by Magnetron Sputtering"; Applied Surface Science; 217 (2003) 88-94.
Kelly et al; "Magnetron Sputtering: A Review of Recent Developments and Applications"; Vacuum 56 (2000) 159-172.
Kelly et al; "Pulsed Magnetron Sputtering—Process Overview and Applications"; Journal of Optoelectronics and Advanced Materials; Vol. 11; No. 9 Sep. 2009; pp. 1101-1107.
Kluth et al; "Modified Thornton Model for Magnetron Sputtered Zinc Oxide: Film Structure and Etching Behaviour"; Thin Solid Films; 442 (2003) 80-85.
Malkomes et al; "Properties of Aluminum-Doped Zinc Oxide Films Deposited by High Rate Mid-Frequency Reactive Magnetron Sputtering"; J. Vac. Sci. Technol. A; 19 (2), Mar./Apr. 2001; pp. 414-419.
Singh et al; "Doping Mechanism in Aluminum Doped Zinc Oxide Films"; Journal of Applied Physics; vol. 95, No. 7 Apr. 2004; pp. 3640-3643.
Tominaga et al; "Influence of Energetic Oxygen Bombardment on Conductive ZNO Films"; Japanese Journal of Applied Physics; vol. 24, No. 8 Aug. 1985; pp. 944-949.
English Translation of JP2015535817 Office Action Dated Aug. 24, 2017, Japan Patent Office.
Ko et al; "Growth of Al-Doped ZnO Thin Films by Pulsed DC Magnetron Sputtering"; Journal of Crystal Growth, vol. 277, No. 1-4; (2005) pp. 352-358.
European Search Report, EP13776932.9 Dated Feb. 15, 2018; 11 pages; European Patent Office.

\* cited by examiner

SPUTTERED TRANSPARENT CONDUCTIVE ALUMINUM DOPED ZINC OXIDE FILMS

CROSS-REFERENCE TO RELATED APPLICATIONS

This application claims the benefit of priority under 35 U.S.C. § 371 of International Application Serial No. PCT/US13/63414, filed on Oct. 4, 2013, which, in turn, claims the benefit of priority under 35 U.S.C. § 119 of U.S. Provisional Patent Application Ser. No. 61/710,848, filed on Oct. 8, 2012 and U.S. Provisional Application Ser. No. 61/731,172 filed on Nov. 29, 2012, the contents of which are relied upon and incorporated herein by reference in their entireties as if fully set forth below.

BACKGROUND

Field

The technology of the disclosure is related to transparent conductive oxide (TCO) films and particularly to aluminum doped zinc oxide (AZO) TCO films.

Technical Background

Transparent conductive oxide (TCO) films are widely used in display and photovoltaic applications where electrical conductivity in layers transparent to visible and near infrared are required. For example, TCO films are used on the cover glass of LCD flat panel displays for addressing the liquid crystal cells, as sensing electrodes in resistive and capacitive touchscreens, and as the transparent contact in photovoltaics. TCO's are also widely used for infrared (IR) mirrors in low emissivity (low-E) glass windows, Indium-tin oxide (ITO) has been the predominant TCO for high-end applications due to its low resistivity (about 1 to $2 \times 10^{-4}$ Ohm·cm), low surface roughness (less than 5 nm $R_a$), environmental durability and ease of patterning. However, the scarcity of indium makes the ITO film expensive, limiting its application. Achieving practical industrial application of lower cost alternatives based on more abundant elements has been a major focus of research in the past several decades.

APCVD-deposited (atmospheric pressure chemical vapor deposition-deposited) fluorine-doped tin oxide (FTO) is widely used for low-E windows and for some photovoltaic (PV) applications where the roughness and defect rates of the APCVD process—performed in-line on the flat glass produced by the "float process"—can be tolerated. Research on off-line processes (those not performed in-line on the float process or other glass production process) has focused mainly on doped zinc oxide materials. LPCVD (low-pressure CVD) has been used to deposit boron-doped zinc oxide TCO to produce high roughness TCO films optimized for the front contact layer in silicon tandem PV. Sputtering is in use or under investigation for producing aluminum-doped zinc oxide (AZO) and gallium-doped zinc oxide (GZO) films for industrial application. These sputtered zinc oxide processes may find a role in CdTe PV or touch applications where smooth films are more desirable, in contrast to the higher roughness films optimal for silicon tandem PV. Etching the relatively smooth doped zinc oxide sputtered films has also been demonstrated to produce controlled roughness suitable for silicon tandem PV (Berginski. et. al. J. Appl. Phys. 101, 074903 (2007)).

The properties of AZO have been extensively reviewed by Elmer (Elmer, J. Phys. D: Appl. Phys. 34 (2001) 3097). The lowest reported resistivity is on the order of $2.0 \times 10^{-4}$ Ohm·cm, and the highest Hall mobility of 60 $cm^2 V^{-1} s^{-1}$.

The optical properties and electrical properties of AZO are not independent—they are linked physically and can be described by the Drude model (see Singh, J. Appl. Phys. 95(7) (2004) 3640). This model explains the thermal as well as electrical and optical properties of metals by the movement of both free and bound electrons. An increase in the free electron concentration leads to higher conductivity. However, it also increases absorption in the infrared (in lower frequency radiation) as the plasma frequency (the frequency above which materials become transparent to EM radiation in the Drude model) increases.

The sputter deposition of AZO has been reported from metal and from ceramic targets, using RF, MF, pulse DC, DC, and RF superimposed DC sputtering. Deposition from metal targets requires precise control of the reactive process to achieve a consistent level of non-stoichiometric oxygen content. AC processes using a twin magnetron and optical emission control are used for large in-line AZO coating. DC sputtering processes with metal targets are more challenging to control because target poisoning produces hysteresis. DC sputtering with oxide targets is also not easy to control, as sputter voltages can be high, especially for light doping levels. Arcing events associated with such high voltage cause particulate contamination and can damage targets. In addition, the resistivity of the deposited films, rather than being uniform, tends to map the shape of the magnetron racetrack.

Literature reports of the optimum AZO deposition temperature vary widely: 150 to 250° C. with metal targets (O. Kluth et. al. Thin Solid Films 442 (2003) 80; J. Chang and M. Hon, Thin Solid Films 386 (2001) 79); 250° C. (T. Minami et. al. J. Cryst. Growth 117 (1992)) to 450° C. (Berginski, et. al. Thin Solid Films 516 (2008) 5836) with ceramic targets and RF sputtering, and 150 to 400° C. with ceramic targets and DC sputtering (Minami, supra). Resistivity is reported to increase above the optimum temperature due to formation of scattering centers (J. Chang and M. Hon, Thin Solid Films 386 (2001) 79). The cause of the scattering has been reported as ionized impurity scattering (J. Chang and M. Hon, Thin Solid Films 386 (2001) 79; T. Minami et. al. J. Cryst. Growth 117 (1992) 370) and excessive grain boundary scattering (J. Chang and M. Hon, Thin Solid Films 386 (2001) 79) due to segregation of dopants and diffusion of alkali contaminants from the glass substrate.

The specific attributes required for a TCO coating for silicon tandem deposition are generally low particulate and defect rates to minimize shunting, low enough resistivity to minimize optical absorption, an absorption edge far enough into the UV to maximize light collection by the aSi cell, a plasma frequency low enough into the infrared to maximize light collection by the mc-Si cell, and tunable roughness to control scattering. Typically the sheet resistance of TCO coatings for silicon tandem is in the range of 8-20 Ohm/sq. Module geometry will determine the optimized sheet resistance, as too high sheet resistance increases undesirably the series resistance of the cells, while too low sheet resistance increases optical absorption undesirably. The optimized TCO is thus a tradeoff of these parameters, as increased doping increases free carrier concentration and lowers resistivity until impurity scattering dominates. The increased doping also increases the band gap due to the Burstein-Moss effect, but also increases the plasma frequency, reducing transmission in the IR.

Environmental durability is also required as silicon tandem panels generally must be rated for 20 years or more lifetime. ZnO is very soluble in any acidic solution, so control of morphology and density are key to minimizing dissolution rate.

Light scattering models show it is desirable to have a relatively thick TCO, with roughness of long spatial frequency to scatter light to higher angles. Sputtered AZO films are relatively smooth compared to the roughness required for light scattering. AZO TCO's for silicon-tandem PV are typically deposited at a higher thickness and then wet etched in dilute HCl to achieve the desired roughness. It has been shown that etching smooth long period craters requires a dense columnar film (Berginski, et. al. SPIE 6197 Y1 (2006); O. Kluth et. al. Thin Solid Films 442 (2003) 80). The optimum geometry has been described as lateral sizes of 1-3 µm and mean opening angles of 120-135° (Berginski, et. al. Thin Solid Films 516 (2008) 5836).

It would be desirable to provide improved AZO TCOs and methods of depositing improved AZO TCOs, capable of simultaneously optimizing transparency, conductivity and surface morphology.

SUMMARY OF THE DETAILED DESCRIPTION

Improved AZO films and the methods of generating the improved AZO films are described. The films are stable, highly conductive, and highly transparent. The grain structure of the AZO films described herein is columnar instead of crown-type, which type (crown-type) has been typically described in the literature when deposited at 250° C. or below with DC. Compared to known previously reported AZO films, the AZO films described herein have the following unique properties: (1) AZO films deposited by pulse DC at temperature above 325° C. show a tight columnar grain structure with columns extending from the bottom to the top of the film, leading to small lateral grain size of the AZO film (less than 70 nm-width grains, extending from substrate to top of film); (2) the resistivity of the AZO film is independent of film thickness above 375 nm; (3) the film has low optical absorption despite high electron mobility; (4) the film has improved thermal stability with no electrical degradation up to 450° C.; and (5) the film has improved chemical durability.

The methods disclosed herein enable the production of a transparent (desirably glass) substrate with an aluminum-doped zinc oxide film of the composition range 0.5-2 wt % $Al_2O_3$, exhibiting a columnar grain structure having columns extending from the bottom to the top of the film, with in-plane grain size less than 70 nm. Further, according to a further aspect, a sheet resistivity of less than 10 Ohm/square may be obtained at a thickness less than 400 nm. According to another aspect, the AZO film has surface roughness $R_a$ less than 10 nm and with film thickness greater than 500 nm. According to yet another aspect, the grain angle of the columnar grain of AZO film is less than 2°, wherein grain angle is defined as the angle between two side walls of the grain, in the direction perpendicular to the substrate. According to still another aspect, the AZO film has a Hall mobility of greater than (45 cm$^2$)/(V·s) and a resistivity of less than $400 \times 10^{-6}$ Ohm·cm. Desirably, the obtained AZO film resistivity is also unchanged with annealing at temperatures up to 450° C. Also desirably, the etch rate of the AZO film in acidic solutions is less than 50% of the rate observed for AZO films deposited below 300° C. and having a crown type grain structure and having a grain angle f greater than 5°.

According to still another aspect, a method for depositing the AZO film of claim is disclosed, including sputtering an oxide target with a composition in the range of 0.5 to 2.0 wt % $Al_2O_3$ in ZnO. According to another aspect of the method, the deposition temperature is greater than 325° C. According to still another aspect of the method, a pulsed DC voltage is applied to the oxide target. According to still another aspect, the duty cycle of the pulse is greater than 40%. Desirably, the power density of a plasma formed by the pulsed DC signal during deposition is between 1 and 2 W/cm$^2$, and desirably, the process pressure is less than 10 mTorr.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

DETAILED DESCRIPTION

Figure 1A:
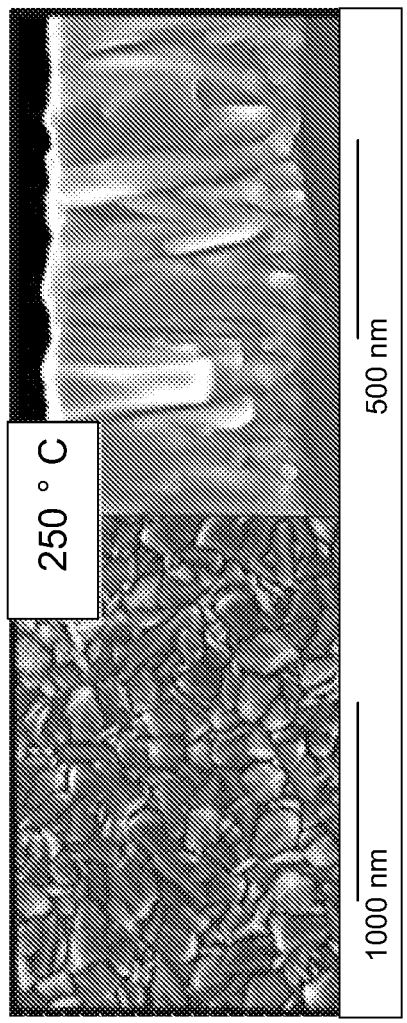
FIGS. 1A and 1B are SEM images (with both cross-sectional and top view) of the grain structure of sputtered AZO films deposited at different temperatures with pulse DC, with an AZO target having a doping level of 1 wt.
Figure 1B:
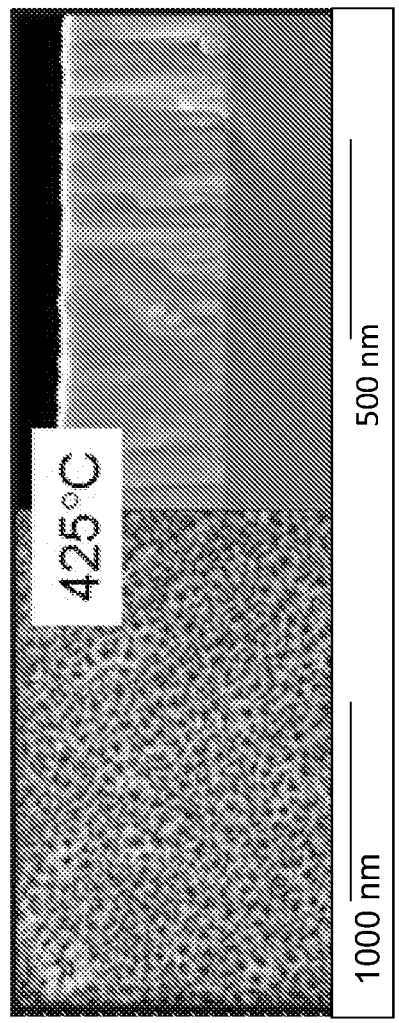

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Improved AZO films and the methods of generating the improved AZO films are described. The films are stable, highly conductive, and highly transparent. The grain structure of the AZO films described herein is columnar instead of crown-type or cone-type, which crown-type grain structure is typically described in literature when deposited at 250° C. or below with DC. Compared to the currently reported AZO films, the AZO films described herein have the following unique properties: (1) AZO films deposited by pulse DC at temperature above 325° C. show columnar grain structure, leading to small lateral grain size of AZO film (less than 70 nm diameter columns extending from substrate to top of film); (2) The resistivity of the AZO film is independent of film thickness above 375 nm; (3) the film has low optical absorption despite high electron mobility; (4) the film is more thermally stable, with no electrical degradation at up to 450° C.; and (5) the film has improved chemical durability.

The methods disclosed herein enable the production of a glass substrate with an aluminum-doped zinc oxide film of the composition range 0.5-2 wt % $Al_2O_3$, exhibiting a columnar grain structure having columns extending from the bottom to the top of the film, with in-plane grain size less than 70 nm. Further, the film preferably exhibits a sheet resistivity of less than 10 Ohm/square and a thickness less than 400 nm. According to another aspect, the AZO film has a surface roughness $R_a$ less than 10 nm and with film thickness greater than 500 nm. According to yet another aspect, the grain angle of the columnar grain of AZO film is less than 2°, wherein grain angle is defined as the angle between two side walls of the grain, in the thickness direction. According to still another aspect, the AZO film has a Hall mobility of greater than 45 $cm^2/(V \cdot s)$ and a resistivity of less than $400 \times 10^{-6}$ Ohm·cm. Desirably, the AZO film resistivity is unchanged with annealing at temperatures up to 450° C. Also desirably, the etch rate of the AZO film in acidic solutions is less than 50% of the rate observed for AZO films deposited below 300° C. with grain of crown type and having a grain angle of greater than 5°.

According to still another aspect, a method for depositing an AZO film further includes sputtering an oxide target having a composition in the range of 0.5 to 2.0 wt % $Al_2O_3$ in ZnO. According to another aspect of the method, the deposition temperature is greater than 325° C. According to still another aspect of the method, a pulsed DC voltage is applied to the oxide target. According to still another aspect, the duty cycle of the pulse is greater than 40%. Desirably, the power density of a plasma formed by the pulsed DC signal is between 1 and 2 $W/cm^2$, and further, desirably, the process pressure is less than 10 mTorr.

The AZO films disclosed herein are very conductive, have good transparency and are also chemically durable, and the sputtering processes of making the AZO films is a generally stable and repeatable process.

EXPERIMENTAL

AZO films were deposited on 150 mm glass substrates in a short throw cryo-pumped PVD system with a 12.9" diameter oxide target sputtered by a pulse DC power supply. Substrates were mechanically clamped to a stainless steel heater and heated with backside Argon up to 425° C. Pulse DC sputtering was found to eliminate target arcing by effectively decreasing sputter voltage linearly with the pulse duty cycle, independent of pulse frequency.

Figure 2:
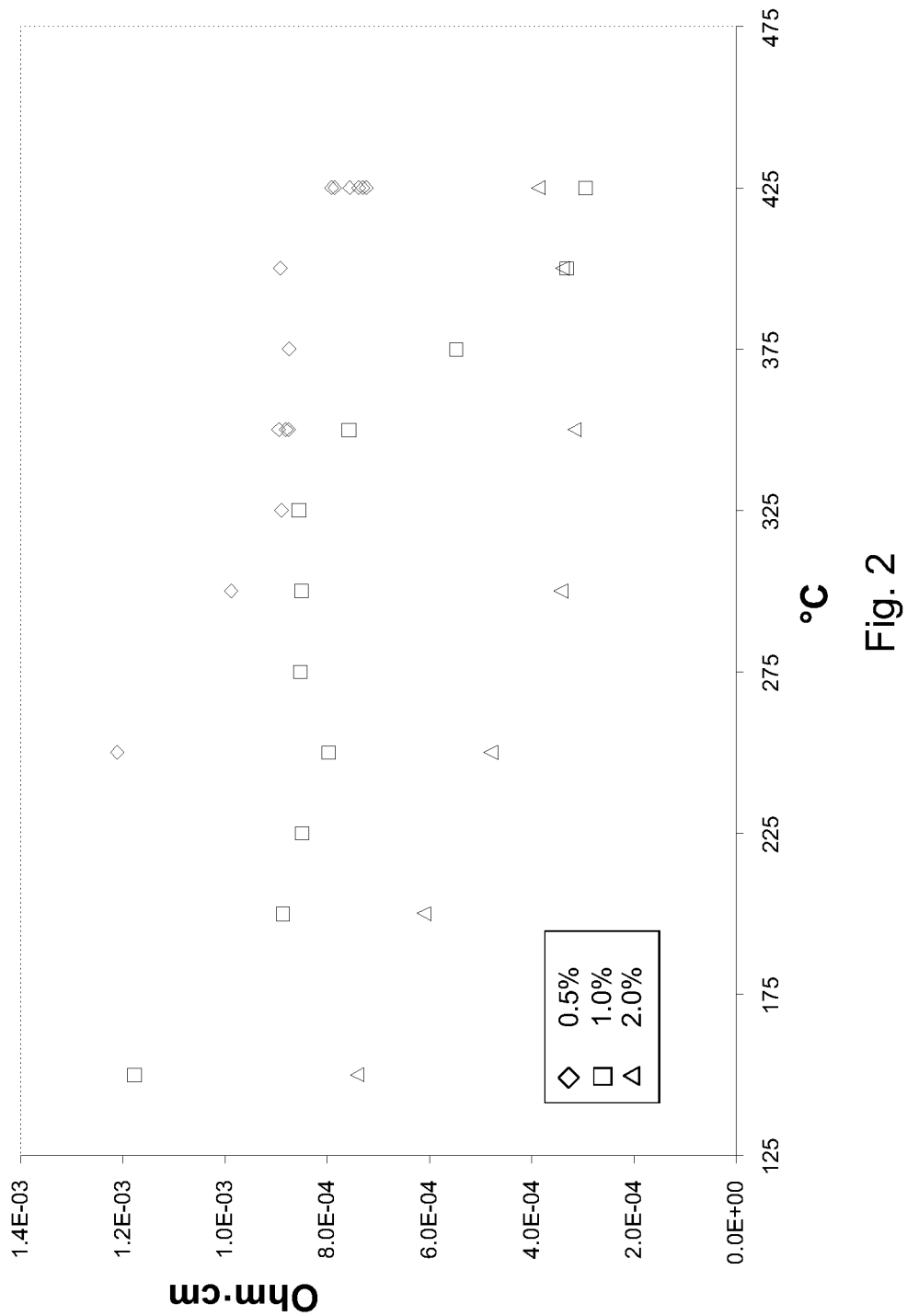
FIG. 2 is a graph, of the resistivity of certain sputtered Al:ZnO films as a function of deposition temperature.

Cross-sectional SEM micrographs of 1.0 wt % AZO deposited at 250° C. and 425° C. are shown in FIGS. 1A (comparative) and 1B (disclosed process and structure). At 250° C., the film observes a columnar morphology with large grains and high surface roughness. At 425° C., the growth is columnar, with grains only 70 nm wide or less, and low surface roughness. X-ray diffraction analysis shows the expected zincite structure with random/multiple orientations at temperatures below 250 C and a strong (002) orientation at temperatures of 350° C. or greater. FIG. 2 shows the resistivity of 0.5 wt %, 1.0 wt %, and 2.0 wt % AZO as a function of deposition temperature. The resistivity of 2% AZO is seen to reach a minimum of ~3.2E-4 Ohm cm at ~350 C. The resistivity of 0.5 wt % AZO is observed to decrease with temperature, reaching a low of 7.50E-4 Ohm cm at the maximum heater temperature of 425° C. The resistivity vs. temperature curve for 1 wt % AZO has two minima. The resistivity makes a first minimum of $8.00 \times 10^{-4}$ at 250° C. where SEM shows crown growth consistent with known techniques. Resistivity at first increases above 250° C., before decreasing, with further increase in temperature, to a second minimum of $2.95 \times 10^{-4}$ Ohm cm at 425 C, where SEM shows the columnar growth recognized herein as preferred.

Figure 3:
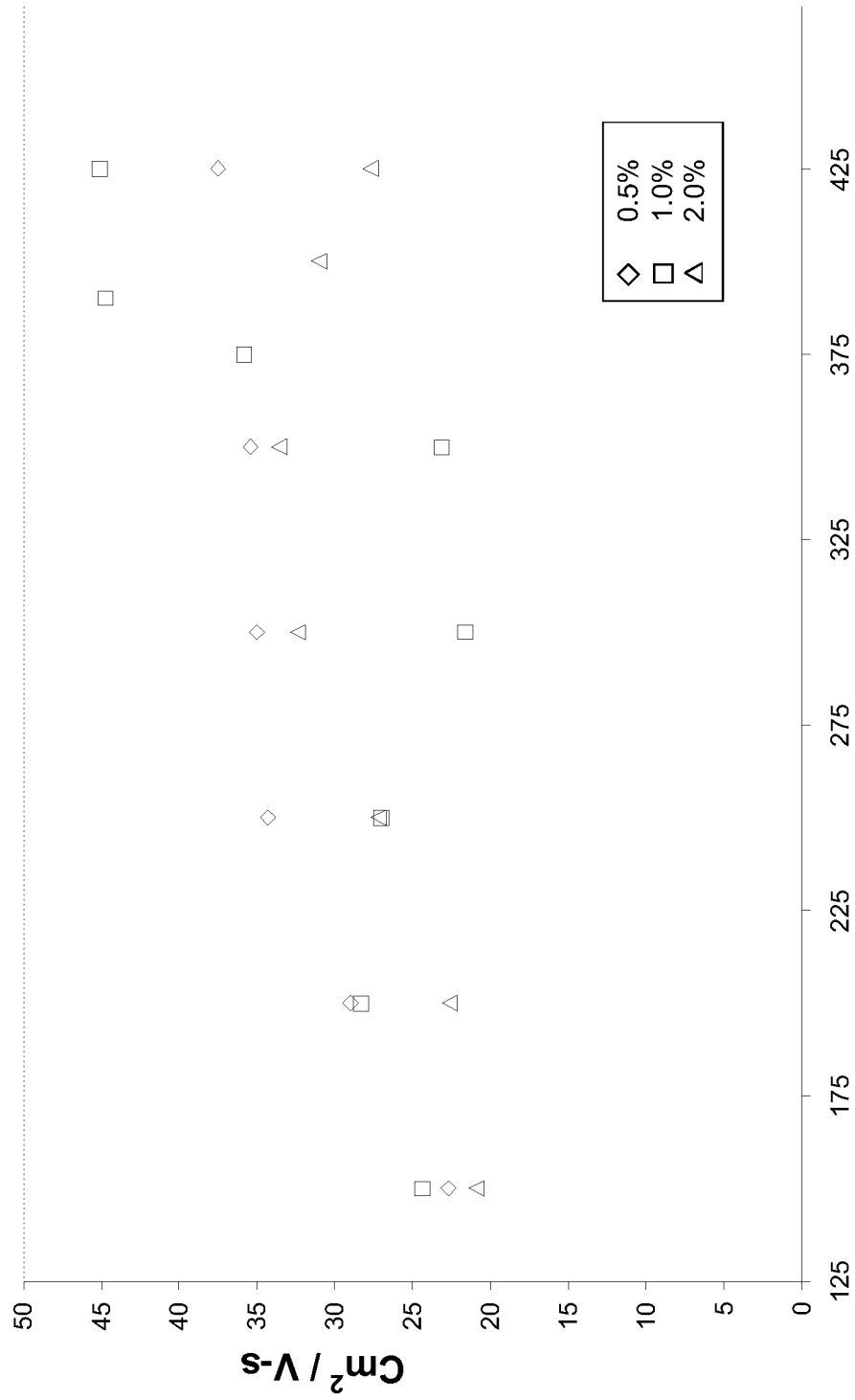
FIG. 3 is a graph showing the Hall mobility of certain sputtered Al:ZnO films as a function of deposition temperature.

Hall measurements shown in FIG. 3 are consistent with the resistivity. The Hall mobility and free carrier density of 2 wt % AZO peak near 350° C. In contrast, the mobility and free carrier density of the 1 wt % AZO follow the 1 wt % resistivity curve with a first minimum near 250° C., where the free carrier concentration continues to increase while the Hall mobility decreases to 21 $cm^2/(V \cdot s)$ before increasing again to 45 $cm^2/(V \cdot s)$ at 425° C. The mobility of 0.5 wt % AZO is seen to increase all the way to 425° C.

Figure 4:
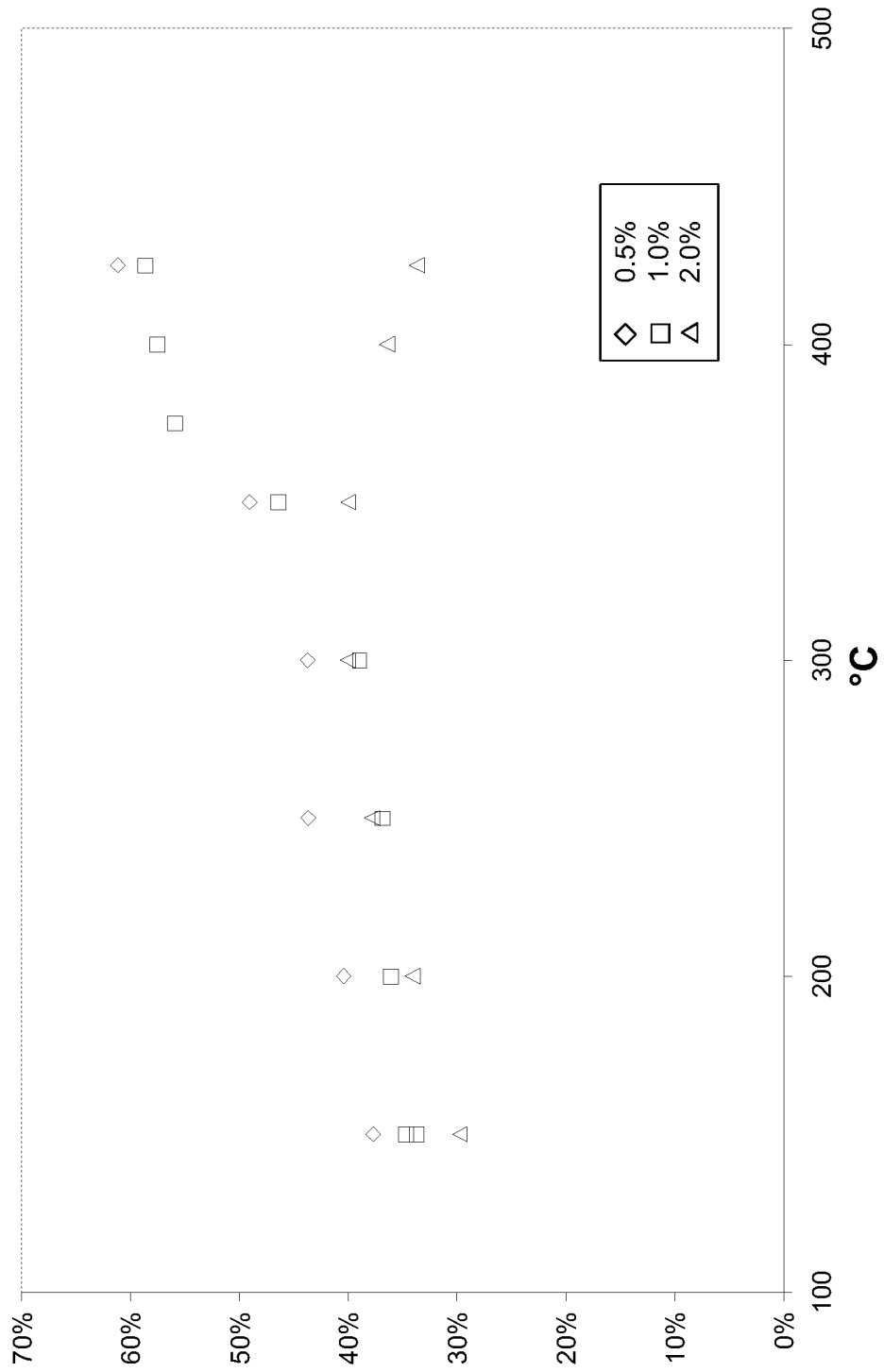
FIG. 4 is a graph showing the dopant activation, calculated from the free carrier concentration and the aluminum content measured by EMPA, of certain sputtered Al:ZnO films as a function of deposition temperature.

FIG. 4 shows the dopant activation as a function of temperature calculated from the free carrier concentration and the aluminum content as measured by EMPA (Eidgenössische Materialprüfungs- und Forschungsanstalt, St. Gallen, Switzerland). In general, dopant activation increases with deposition temperature. However, the slope of activation versus temperature above 350° C. increases for 0.5 wt % and 1.0 wt % AZO, and turns negative for 2.0% AZO. Over 60% activation is observed for 0.5 wt % and 1.0 wt % AZO at temperatures above 400° C. (Dopant activation of 40% is reported in prior art for AZO films deposited under optimum conditions with metallic targets at 200° C.) Resistivity versus thickness for 1 wt % AZO films deposited at 425° C. is shown in FIG. 4. Resistivity is observed to decrease to below $300 \times 10^{-6}$ Ohm·cm for films only 375 nm thick. In prior art, a resistivity of over $550 \times 10^{-6}$ Ohm·cm is observed at 400 nm thickness, and resistivity does not decrease below $400 \times 10^{-6}$ Ohm·cm until a film thickness of 1 micron.

Figure 5A:
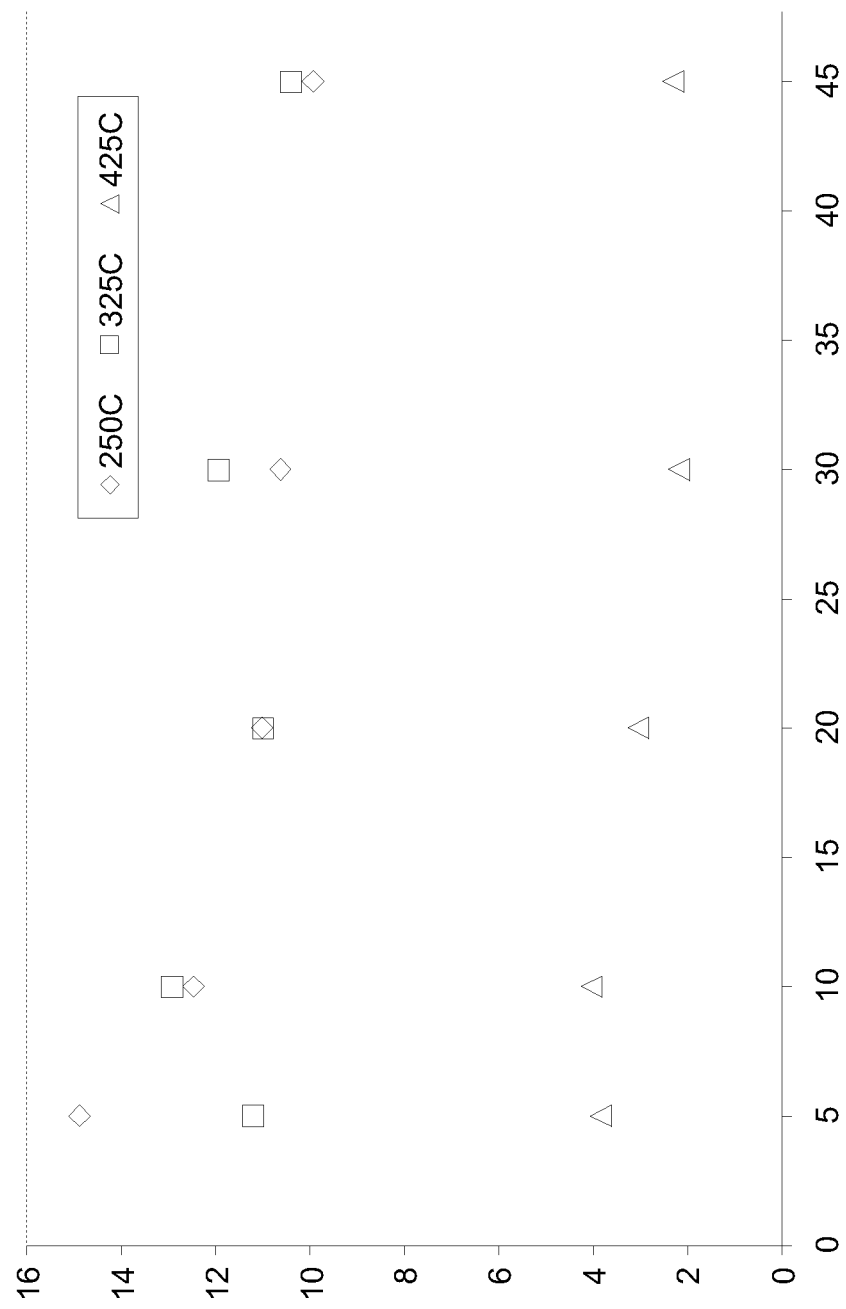
FIGS. 5A and 5B are graphs showing, respectively, etch rate and peak-to-valley roughness of certain sputtered Al:ZnO films as a function of etch time.
Figure 5B:
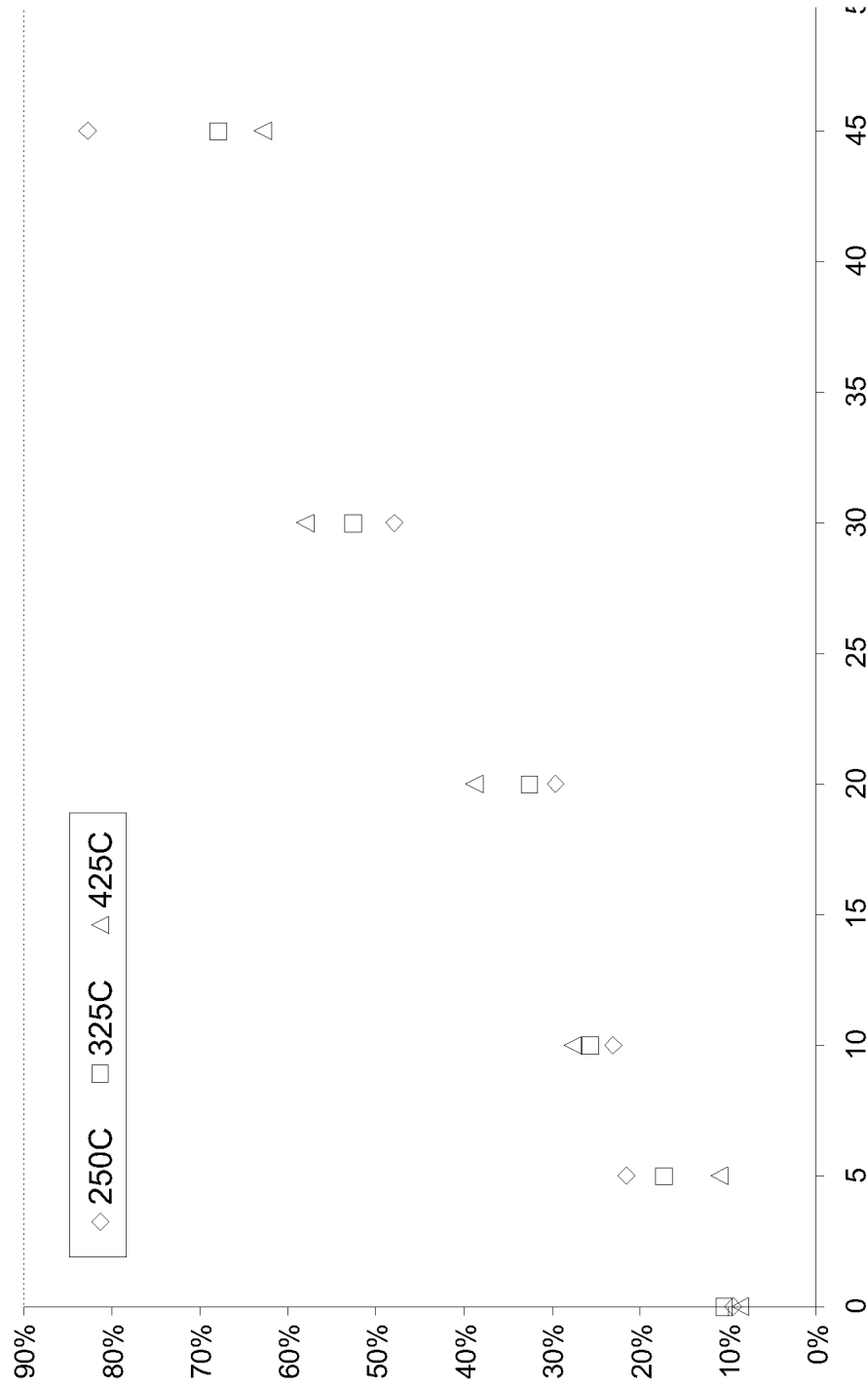
Figure 6:
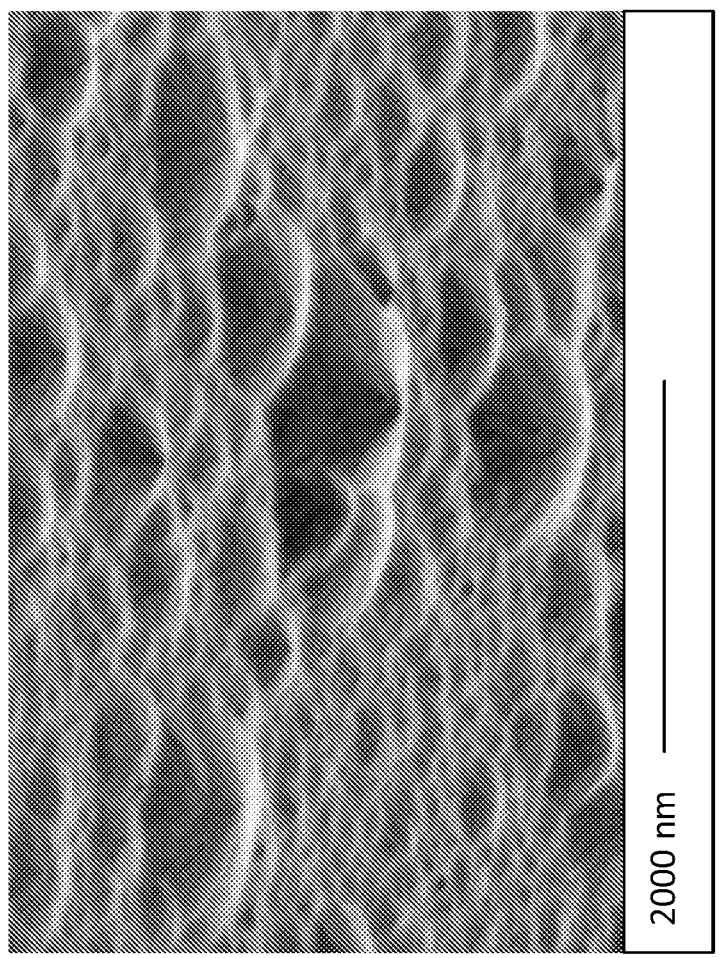
FIG. 6 is an SEM image of an etched AZO film deposited by pulse DC at temperature above 350° C.

FIG. 5A shows the etch rate and FIG. 5B the peak to valley surface roughness normalized to thickness created by etching 1% AZO films deposited at 250°, 325°, and 425° C. for times between 5 and 50 seconds. The etch rate of 1% AZO deposited at 425° C. was only one third that of AZO deposited at the lower temperatures. The average surface roughness ($R_a$), normalized to thickness ($R_a$/th), was lower as well, especially at longer etch times. However, the peak to valley roughness normalized to thickness (Rp-v/th shown in FIG. 5B) was not greatly different. With etch times over 30 seconds, the peak to valley roughness exceeded 50% of film thickness. The cause of this discrepancy between etch rate and $R_a$/th, and $R_{p-v}$/th can be seen in the AFM images of 1% AZO deposited at 425° C. shown in FIG. 6. The surface after etching is relatively smooth except for large pits which form if etch time exceeds 20 seconds. This etched surface morphology leads to improved light scattering—see, e.g., O. Kluth et. al. Thin Solid Films 442, 80 (2003).

Many modifications and other embodiments of the embodiments set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

What is claimed is:

1. A transparent substrate with an aluminum-doped zinc oxide (AZO) film thereon, comprising:
a transparent substrate;
an AZO film on and in contact with the substrate, the film having a composition in a range 0.5-2 wt % $Al_2O_3$ and a columnar grain structure having columns extending from a bottom to a top of the film, with in-plane grain size less than 70 nm the AZO film having a resistivity, wherein the resistivity is unchanged by annealing at temperatures of up to 450° C.

2. The substrate with an AZO film thereon of claim 1 wherein the AZO film has a sheet resistivity of less than 10 Ohm/square and a thickness less than 400 nm.

3. The substrate with an AZO film thereon of claim 1 wherein the AZO film has a surface roughness $R_a$ less than 10 nm and a film thickness greater than 500 nm.

4. The substrate with an AZO film thereon of claim 3 wherein the AZO film has a sheet resistivity of less than 10 Ohm/square.

5. The substrate with an AZO film thereon according to claim 1, wherein a grain angle of the columnar grain structure of the AZO film is less than 2°, wherein the grain angle is defined as the angle between two side walls of the columnar grain structure, the two sidewalls extending in a direction generally perpendicular to the substrate.

6. The substrate with an AZO film thereon according to claim 5 wherein the AZO film has an electron mobility of greater than (45 $cm^2$)/(Vs) and a resistivity of less than $400\times10^{-6}$ Ohm·cm.

7. The substrate with an AZO film thereon according to claim 1 wherein an etch rate of said AZO film in acidic solutions is less than 50% of a corresponding etch rate observed for AZO films deposited below 300° C. and having a grain structure of crown type and having a grain angle of greater than 5°, wherein the grain angle is defined as the angle between two side walls of the grain structure.

8. The substrate with an AZO film thereon according to claim 1 wherein the transparent substrate comprises a glass substrate.

9. The substrate with an AZO film thereon according to claim 2, wherein a grain angle of the columnar grain structure of the AZO film is less than 2°, wherein grain angle is defined as the angle between two side walls of the columnar grain structure, the two sidewalls extending in a direction generally perpendicular to the substrate.

10. The substrate with an AZO film thereon according to, claim 3 wherein a grain angle of the columnar grain structure of the AZO film is less than 2°, wherein grain angle is defined as the angle between two side walls of the columnar grain structure, the two sidewalls extending in a direction generally perpendicular to the substrate.

11. The substrate with an AZO film thereon according to claim 6 wherein the AZO film has an electron mobility of greater than (45 $cm^2$)/(Vs) and a resistivity of less than $400\times10^{-6}$ Ohm·cm.

12. The substrate with an AZO film thereon according to claim 5 wherein the AZO film has an electron mobility of greater than (45 $cm^2$)/(Vs) and a resistivity of less than $400\times10^{-6}$ Ohm·cm.

13. The substrate with an AZO film thereon according to claim 1 wherein the AZO film has an electron mobility of greater than (45 $cm^2$)/(Vs) and a resistivity of less than $400\times10^{-6}$ Ohm·cm.

\* \* \* \* \*

UNITED STATES PATENT AND TRADEMARK OFFICE
CERTIFICATE OF CORRECTION

PATENT NO. : 9,984,786 B2  
APPLICATION NO. : 14/434229  
DATED : May 29, 2018  
INVENTOR(S) : Robert Alan Bellman et al.

Page 1 of 1

It is certified that error appears in the above-identified patent and that said Letters Patent is hereby corrected as shown below:

On the Title Page

Item [72], Line 3, delete "Addison, NY (US);" and insert -- Freeville, NY (US); --, therefor.

Column 2, item [56], other publications, Line 1, delete "Zn0" and insert -- ZnO --, therefor.

Page 2, Column 1, item [56], other publications, Line 14, delete "Zn0" and insert -- ZnO --, therefor.

Page 2, Column 1, item [56], other publications, Line 20, delete "Zn0" and insert -- ZnO --, therefor.

Page 2, Column 1, item [56], other publications, Line 23, delete "Zn0" and insert -- ZnO --, therefor.

Page 2, Column 2, item [56], other publications, Line 1, delete "Zn0" and insert -- ZnO --, therefor.

In the Claims

Column 8, Line 17, Claim 10, delete "according to," and insert -- according to --, therefor.

Signed and Sealed this  
Tenth Day of December, 2019

Andrei Iancu  
*Director of the United States Patent and Trademark Office*